United States Patent
Lee et al.

(10) Patent No.: US 9,743,524 B1
(45) Date of Patent: Aug. 22, 2017

(54) CHIP ELECTRONIC COMPONENT AND BOARD HAVING THE SAME MOUNTED THEREON

(71) Applicant: SAMSUNG ELECTRO-MECHANICS CO., LTD., Suwon-si, Gyeonggi-do (KR)

(72) Inventors: Kyo Kwang Lee, Suwon-si (KR); Young Ghyu Ahn, Suwon-si (KR); Jin Kim, Suwon-si (KR); Ho Jun Lee, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/291,745

(22) Filed: Oct. 12, 2016

(30) Foreign Application Priority Data

Feb. 3, 2016 (KR) .................. 10-2016-0013663

(51) Int. Cl.
*H05K 1/18* (2006.01)
*H01G 4/00* (2006.01)
(Continued)

(52) U.S. Cl.
CPC ............ *H05K 1/181* (2013.01); *H01G 4/005* (2013.01); *H01G 4/224* (2013.01); *H01G 4/248* (2013.01);
(Continued)

(58) Field of Classification Search
CPC ................. H05K 1/111; H05K 1/181; H05K 2201/10636; H05K 1/10651;
(Continued)

(56) References Cited

U.S. PATENT DOCUMENTS 9,064,626 B2 * 6/2015 Yoo ...................... H01F 17/0013
2003/0030510 A1 2/2003 Sasaki et al.
(Continued)

FOREIGN PATENT DOCUMENTS

JP 2003-060463 A 2/2003
KR 10-2007-0069431 A 7/2007
(Continued)

OTHER PUBLICATIONS

Office Action dated May 1, 2017 in the corresponding Korean Patent Application No. 10-2016-0013663, with English language translation.

*Primary Examiner* — Hoa C Nguyen
(74) *Attorney, Agent, or Firm* — McDermott Will & Emery LLP (57) ABSTRACT

A chip electronic component includes a body, in which a distance from a first surface to a second surface opposing with respect to the first surface is equal to or less than a distance from a third surface to a fourth surface opposing with respect to the third surface, a first internal electrode, and a second internal electrode exposed to the second surface of the body, and spaced apart from the third surface and the fourth surface of the body by a predetermined distance. A first corner protection portion is disposed on portions of surfaces adjacent to a first corner, where the first corner is a corner formed by the first surface, the third surface and the fifth surface of the body.

19 Claims, 7 Drawing Sheets

(51) Int. Cl.
  *H01G 4/005* (2006.01)
  *H01G 4/248* (2006.01)
  *H01G 4/224* (2006.01)
  *H05K 1/11* (2006.01)
  *H01G 4/30* (2006.01)

(52) U.S. Cl.
  CPC ............... *H01G 4/30* (2013.01); *H05K 1/111* (2013.01); *H05K 2201/10015* (2013.01)

(58) Field of Classification Search
  CPC .... H05K 1/10015; H01G 4/005; H01G 4/228; H01G 4/30; H01G 5/011; H01G 5/04
  See application file for complete search history.

(56) References Cited

U.S. PATENT DOCUMENTS

| | | | |
|---|---|---|---|
| 2004/0226733 A1* | 11/2004 | Anthony | H01G 4/35 174/394 |
| 2008/0310078 A1 | 12/2008 | Lee et al. | |
| 2011/0127680 A1* | 6/2011 | Masuda | H01G 2/06 257/779 |
| 2014/0160616 A1 | 6/2014 | Yoon et al. | |
| 2014/0368968 A1 | 12/2014 | Lee et al. | |
| 2015/0213957 A1 | 7/2015 | Choi et al. | |
| 2015/0243439 A1* | 8/2015 | Kwag | H01G 4/012 174/260 |
| 2016/0050760 A1* | 2/2016 | Tamagawa | H01C 1/012 361/752 |
| 2016/0088733 A1* | 3/2016 | Lee | H05K 3/3442 361/768 |

FOREIGN PATENT DOCUMENTS

| | | |
|---|---|---|
| KR | 2008-0110180 A | 12/2008 |
| KR | 2014-0075273 A | 6/2014 |
| KR | 10-2014-0145831 A | 12/2014 |
| KR | 10-2015-0089141 A | 8/2015 |

* cited by examiner

CHIP ELECTRONIC COMPONENT AND BOARD HAVING THE SAME MOUNTED THEREON

CROSS-REFERENCE TO RELATED APPLICATION

This application claims the benefit of priority to Korean Patent Application No. 10-2016-0013663, filed on Feb. 3, 2016 with the Korean Intellectual Property Office, the entirety of which is incorporated herein by reference.

TECHNICAL FIELD

The present disclosure relates to a chip electronic component and a board having the chip electronic component mounted thereon.

BACKGROUND

In line with the recent trend towards electronic products being miniaturized and implemented with high capacitance, electronic components used for such electronic products have also been required to be miniaturized and to have high capacitance. Thus, demand for chip type electronic components has increased.

Furthermore, in the case of a multilayer ceramic capacitor as a chip type electronic component, performance of the electronic product may be degraded when equivalent series inductance (hereafter, ESL) is increased. As electronic components are miniaturized and implemented with high capacitance, an effect in which an increase in ESL causes functioning of the electronic component to be degraded may be increased.

To reduce ESL in the chip type electronic component, a low inductance chip capacitor (LICC) may be implemented. An LICC is an electronic component in which a distance between external terminals is reduced to reduce a path of current flow, thereby reducing the inductance of the capacitor.

The multilayer ceramic capacitor of the chip type electronic component may have a structure in which internal electrodes having opposing polarities are alternately stacked with a plurality of dielectric layers interposed therebetween. Since the dielectric layer has piezoelectric properties and piezoresistive properties, when a direct current (DC) or alternating current (AC) voltage is applied to the multilayer ceramic capacitor, a piezoelectric phenomenon may occur between the internal electrodes, whereby vibrations may occur. As the vibrations are transferred to a substrate on which the multilayer ceramic capacitor is mounted, through solders of the multilayer ceramic capacitor, the entire substrate may act as a sound radiating surface and may generate acoustic noise, which is experienced by the user as noise.

In addition, chipping of the chip electronic component may occur through movement between processes and impacts between chip electronic components during a process, thereby significantly degrading reliability of the chip electronic component. In detail, such chipping, degrading reliability of chip type electronic components, frequently occurs in corners and edges formed by different surfaces of the chip type electronic component.

SUMMARY

An aspect of the present disclosure provides a chip electronic component and a board having the same mounted thereon and, particularly, a chip electronic component in which equivalent series inductance and acoustic noise are reduced while reliability is secured, and a board having the same mounted thereon.

According to an aspect of the present disclosure, a chip electronic component includes a body including an internal electrode in an interior thereof, and a first external electrode and a second external electrode disposed on exteriors of the body, and further includes a corner protection portion disposed on portions of surfaces adjacent to at least one corner of the body.

The body may have a first surface and a second surface opposing each other, a third surface and a fourth surface opposing each other, and a fifth surface and a sixth surface opposing each other. In addition, a distance from the first surface to the second surface of the body may be equal to or less than a distance from the third surface to the fourth surface of the body.

The first internal electrode and the second internal electrode formed in the interior of the body may be drawn out to the first surface and the second surface of the body, and may include lead portions drawn out to the first surface and the second surface as a portion of a main portion, which is overlapped with an adjacent internal electrode to allow capacitance to be formed, is led out.

The first external electrode and the second external electrode may be disposed on regions of the first surface and the second surface of the body while being connected to the first internal electrode and the second internal electrode drawn out to the first surface and the second surface of the body, respectively.

The chip electronic component may include a corner protection portion on portions of surfaces adjacent to at least one corner of the body. Here, the corner may be a connection portion formed by three adjacent surfaces of first to sixth surfaces of the body.

In the chip electronic component according to an exemplary embodiment in the present disclosure, a corner formed by the fifth surface of the body, and the first surface and the third surface, adjacent to the fifth surface, is a first corner, and a protection portion included on the surfaces adjacent to the first corner may be a first corner protection portion.

A board having a chip electronic component mounted thereon according to another exemplary embodiment in the present disclosure includes a board having an electrode pad on an upper surface thereof, a chip electronic component installed on the board, and a solder connecting the electrode pad to the chip electronic component.

In the board having the chip electronic component mounted thereon, the chip electronic component mounted on the board may include a body having a first surface and a second surface opposing each other, a third surface and a fourth surface opposing each other, and a fifth surface and a sixth surface opposing each other, and in which a distance from the first surface to the second surface is equal to or less than a distance from the third surface to the fourth surface, a first internal electrode formed in an interior of the body, exposed to the first surface of the body, and spaced apart from the third surface and the fourth surface of the body, and a second internal electrode formed in the interior of the body, exposed to the second surface of the body, and spaced apart from the third surface and the fourth surface of the body. In addition, the chip electronic component may further include a first external electrode formed on the first surface of the body and connected to the first internal electrode, and a second external electrode formed on the second surface of the body and connected to the second internal electrode. In addition, the chip electronic component may further include a first corner protection portion on portions of surfaces adjacent to a first corner, which is a corner formed by the fifth surface of the body, and the first surface and the third surface, adjacent to the fifth surface.

BRIEF DESCRIPTION OF THE DRAWINGS

The above and other aspects, features and advantages of the present disclosure will be more clearly understood from the following detailed description taken in conjunction with the accompanying drawings, in which.

DETAILED DESCRIPTION

Hereinafter, exemplary embodiments in the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Chip Electronic Component

Hereinafter, a chip electronic component according to an exemplary embodiment is described and, in detail, a multilayer capacitor is described as an example without limitation.

According to an exemplary embodiment in the present disclosure, a T-direction is a thickness direction of a body of a chip electronic component, an L-direction is a length direction of the body, and a W-direction is a width direction of the body. When the chip electronic component is a multilayer capacitor, the T-direction may be a dielectric layer stacking direction.

According to an exemplary embodiment in the present disclosure, a first surface S1 and a second surface S2 opposing each other may be two surfaces opposing each other in the width direction of the body, a third surface S3 and a fourth surface S4 opposing each other may be two surfaces opposing each other in the length direction of the body, and a fifth surface S5 and a sixth surface S6 opposing each other may be two surfaces opposing each other in the thickness direction of the body.

Here, a distance between the first surface S1 and the second surface S2 spaced apart from each other in a width direction of the body and disposed to oppose each other, is equal to or less than a distance between the third surface S3 and the fourth surface S4 spaced apart from each other in a length direction of the body and disposed to oppose each other.

Figure 1:
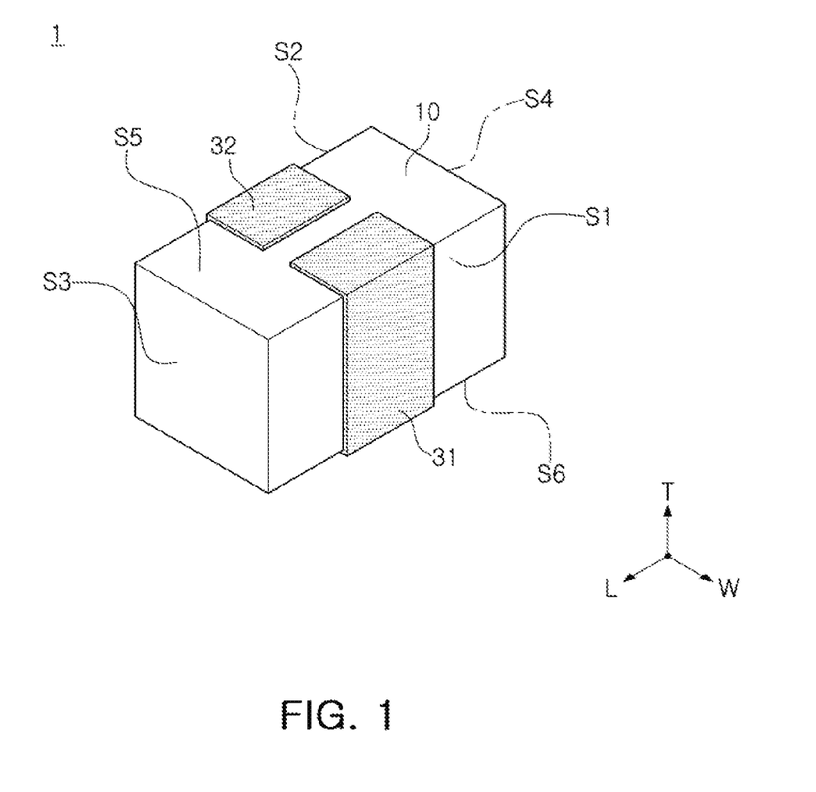
FIG. 1 is a schematic perspective view of a body and external electrodes formed on exteriors of the body according to an exemplary embodiment in the present disclosure.
Figure 2A:
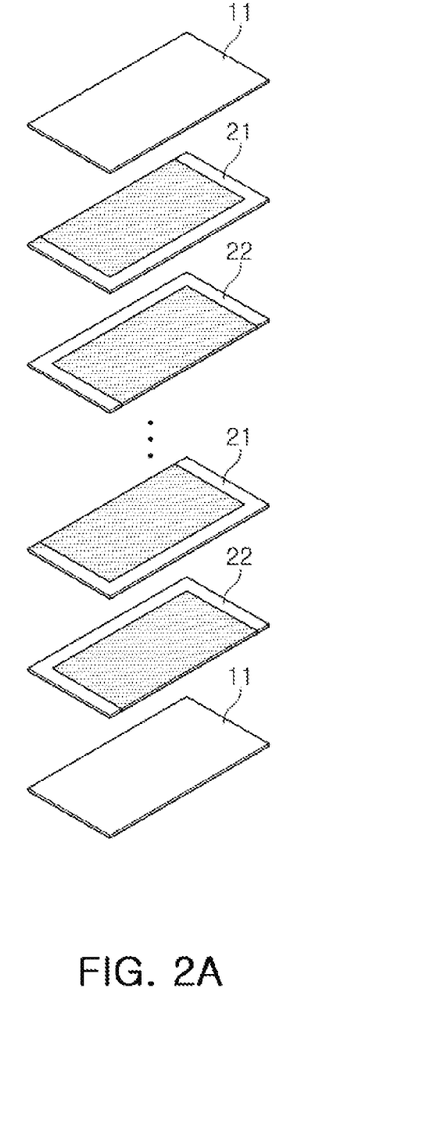
FIGS. 2A and 2B are exploded perspective views of the body in FIG. 1.
Figure 2B:
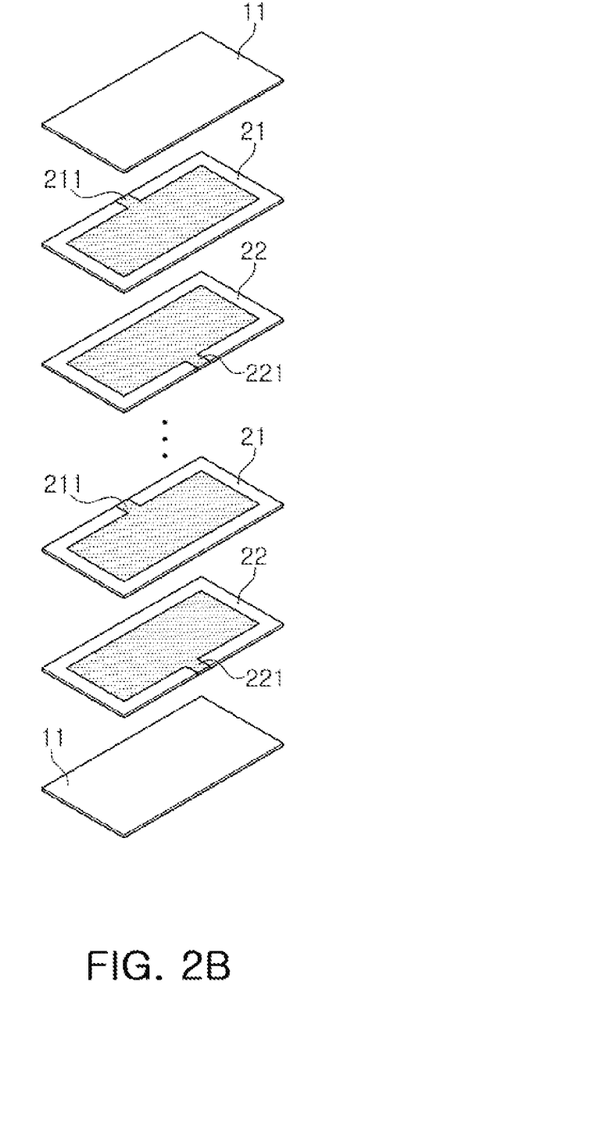

FIG. 1 is a schematic perspective view of a body and an external electrode formed on an exterior of the body according to an exemplary embodiment, and FIGS. 2A and 2B are exploded perspective views of the body in FIG. 1.

With reference to FIG. 1, a chip electronic component 1 according to an exemplary embodiment includes a body 10 and external electrodes 31 and 32 disposed on exteriors of the body.

The body 10 may have a first surface S1 and a second surface S2 opposing each other, a third surface S3 and a fourth surface S4 opposing each other, and a fifth surface S5 and a sixth surface S6 opposing each other. A form of the body 10 may be hexahedral, as illustrated in FIG. 1, but is not limited thereto.

A first external electrode 31 and a second external electrode 32 are disposed on the body 10. The first external electrode 31 and the second external electrode 32 may be at a spaced apart from each other by a predetermined distance in a width direction of the body to be disposed on the first surface S1 and the second surface S2 opposing each other, respectively.

With regard to arrangement of the first external electrode and the second external electrode of the chip electronic component according to an exemplary embodiment, for example, in a multilayer capacitor according to the related art, external electrodes are disposed on exteriors of two surfaces opposing each other in a length direction of a capacitor body. A distance of the capacitor body in a length direction thereof is taken as being longer than a distance of the capacitor body in a width direction thereof. In this case, when an alternating current (AC) voltage is applied to the external electrodes, a current path is longer, and thus, a current loop may be formed to be larger. Thus, as a size of an induced magnetic field is increased, inductance may be increased.

However, in a chip electronic component according to the present exemplary embodiment, as a first external electrode and a second external electrode are disposed on a first surface S1 and a second surface S2 opposing each other in the width direction of the body, which is a small displacement direction, a distance between the first external electrode 31 and the second external electrode 32 is reduced. In this case, as a current path is shorter, a current loop is reduced, and thus, inductance may be reduced.

The first external electrode 31 and the second external electrode 32 may be respectively electrically connected to a first internal electrode 21 and a second internal electrode 22 disposed in an interior of the body, to be described later, for the formation of electrostatic capacitance.

The first external electrode 31 and the second external electrode may be formed of a conductive material, which is the same material as the first internal electrode and the second internal electrode, but are not limited thereto. For example, the first external electrode and the second external electrode may be formed of copper (Cu), silver (Ag), nickel (Ni), or the like.

The first external electrode and the second external electrode 32 may be formed as conductive paste prepared by adding glass frit to metal powder which is then applied to the first surface S1 and the second surface S2 and sintered.

With reference to FIG. 2A, the body 10 includes dielectric layers 11, and first internal electrodes 21 and second internal electrodes 22 formed on the dielectric layers.

With reference to FIG. 2B, the first internal electrode 21 may include a first lead portion 211 spaced apart from the third surface S3 and the fourth surface S4, opposing each other in the length direction of the body by a predetermined distance, and drawn out to the first surface S1 of the body. In addition, the second internal electrode 22 may include a second lead portion 221 spaced apart from the third surface S3 and the fourth surface S4, opposing each other in the length direction of the body by a predetermined distance, and drawn out to the second surface S2 of the body.

The dielectric layer 11 may be formed by adding various materials, such as a ceramic additive, an organic solvent, a plasticizer, a binder, a dispersant, and the like to a powder formed of a material such as barium titanate ($BaTiO_3$), or the like, according to an objective of the present disclosure.

An average particle size of ceramic powder used for the formation of the dielectric layer 11 is not particularly limited, and may be adjusted to achieve an objective of the present disclosure. For example, the average particle size thereof may be adjusted to be 400 nm or less.

A thickness of the dielectric layer 11 may be, for example, 3 μm or less, but is not limited thereto.

A material included in the first internal electrode 21 and the second internal electrode 22 may include, for example, a noble material such as palladium (Pd), a palladium-silver (Pd—Ag) alloy, or the like, or a conductive paste formed of one or more transitional metals such as nickel (Ni) and copper (Cu), but is not limited thereto.

The first internal electrode 21 and the second internal electrode 22 may be disposed to face each other with respective dielectric layers 11 interposed therebetween, and may be alternately exposed to the first surface S1 and the second surface S2 of the body 10.

The first internal electrode 21 and the second internal electrode 22 include a main portion overlapped with adjacent internal electrodes to allow capacitance to be formed. In addition, the first internal electrode 21 and the second internal electrode 22 may respectively include lead portions 211 and 221 drawn out to exterior surfaces of the body as a portion of the main portion is led out.

The lead portion, for example, may have a shorter length than the main portion of the internal electrode in the body 10 in a length direction, but is not limited thereto.

The chip electronic component according to an exemplary embodiment may include a corner protection portion on portions of surfaces adjacent to at least one corner of the body. As one example of a chip electronic component shown in FIG. 3, a first corner is disposed as a corner formed by three surfaces, the fifth surface S5 of the body, and the first surface S1 and the third surface S3 adjacent thereto, and a first corner protection portion 41a is disposed on portions of surfaces adjacent to the first corner.

In the chip electronic component according to an exemplary embodiment, external electrodes are disposed on both surfaces opposing each other in a width direction of the body rather than on both surfaces opposing each other in a length direction of the body, in a manner different from a multilayer capacitor according to the related art.

As a result, a corner formed by three adjacent surfaces of the body is exposed outwardly as it is as external electrodes are not coated. When a chip electronic component is manufactured, physical impacts between chip electronic components may be generated by movement between a plurality of processes and treatment during a plurality of processes, whereby unexpected chipping may occur. Chipping may reduce the reliability of the chip electronic component and the production yield of the chip electronic component.

Figure 3:
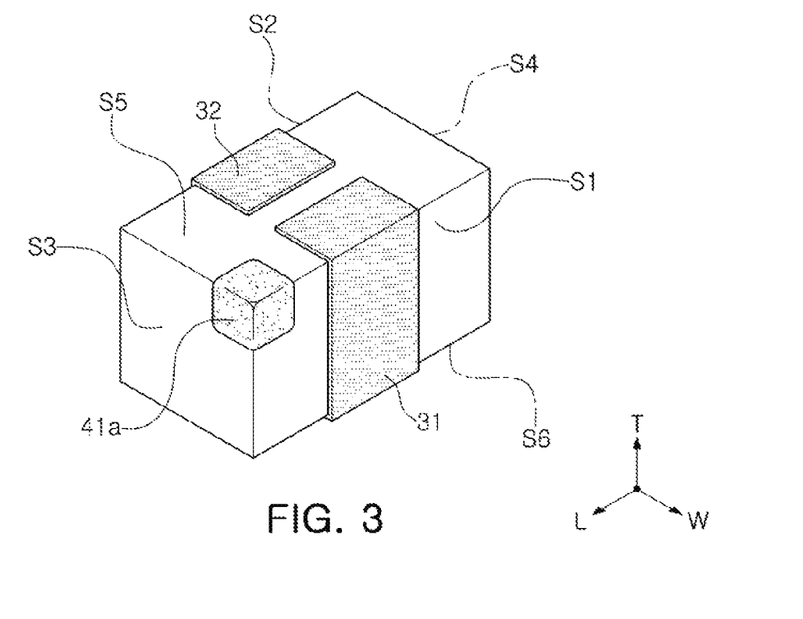
FIG. 3 is a schematic perspective view of a chip electronic component according to an exemplary embodiment in the present disclosure.

However, in a case of a chip electronic component according to an exemplary embodiment, the first corner protection portion 41a is disposed on portions of surfaces adjacent to the first corner, and thus, chipping caused by physical impacts between chip electronic components may be effectively prevented. As a result, reliability and production yield of the chip electronic component may be improved at the same time.

The first corner protection portion 41a may be formed of a material attached to a surface adjacent to the first corner of the body to prevent chipping, for example, an insulating material, but is not limited thereto.

In addition, the insulating material may be a heat curable resin, for example, one selected from a group consisting of an epoxy resin, a cyanateester resin, a maleimide resin, a bismaleimide-triazine resin, a phenolic resin, a resorcinol resin, a unsaturated polyester resin, a diallylphthalate resin, a urea resin, melamine resin, a benzoxazine resin, polyurethane, and a mixture thereof, but is not limited thereto.

The first corner protection portion 41a may be formed of a plating material containing Cu (copper). When the first corner protection portion 41a is formed of an insulating material, a heat curable resin, the first corner protection portion may be formed through a sintering process separate from a curing process of a chip electronic component. In a manner different therefrom, when the first corner protection portion 41a of the chip electronic component is formed of a plating material containing Cu, the first corner protection portion 41a may be formed on portions of surfaces adjacent to the first corner of the body while an external electrode and the like are sintered.

Figure 4:
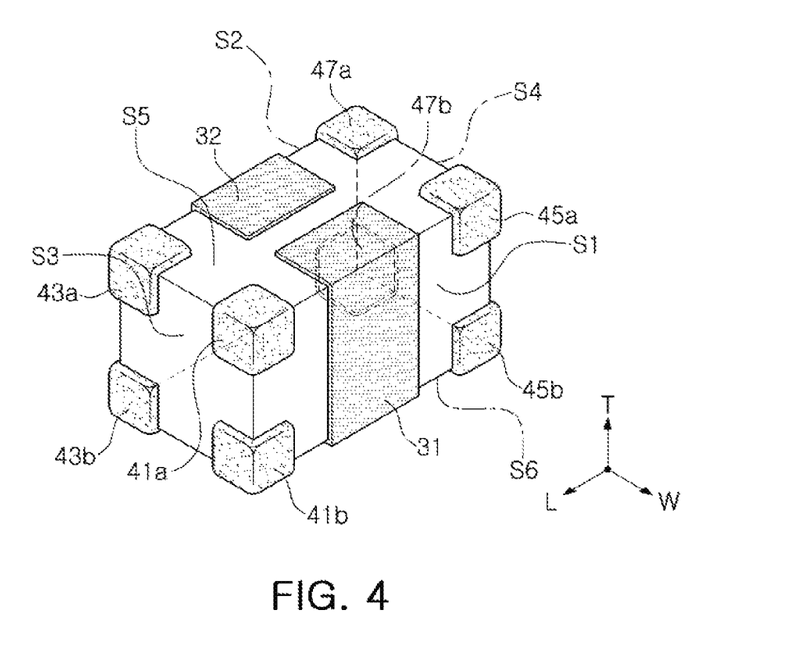
FIG. 4 is a schematic perspective view of a chip electronic component according to another exemplary embodiment in the present disclosure.

Next, FIG. 4 illustrates an example of a chip electronic component according to another exemplary embodiment. The chip electronic component shown in FIG. 4 includes a first corner protection portion 41a disposed on portions of surfaces adjacent to a first corner. In addition, the chip electronic component may further include second to eighth corner protection portions 41b, 43a, 43b, 45a, 45b, 47a, and 47b. An example of the chip electronic component according to the present exemplary embodiment is not limited thereto.

In other words, the chip electronic component according to an exemplary embodiment may be manufactured to allow the first corner protection portion 41a formed on portions of surfaces adjacent to the first corner to be disposed on a corner of a body region of the chip electronic component, and to further include one or more of the second to eighth corner protection portions, in consideration of expected impact strength during a process, an expected movement path between processes, and the like.

The second corner protection portion 41b may oppose a first corner in a thickness direction of the body, and may be disposed on portions of surfaces adjacent to a second corner formed by a sixth surface S6 of the body, and a first surface S1 and a third surface S3 adjacent thereto.

In a manner similar thereto, a third corner protection portion 43a may oppose the first corner in a width direction of the body, and may be disposed on portions of surfaces adjacent to a third corner formed by a fifth surface S5 of the body, and a second surface S2 and a third surface S3 adjacent thereto.

As an arrangement of the fourth to eighth corner protection portions 43b, 45a, 45b, 47a, and 47b may be more clearly identified through FIG. 4, a description related to the arrangement of the fourth to eighth corner protection portions is not described here.

Figure 5:
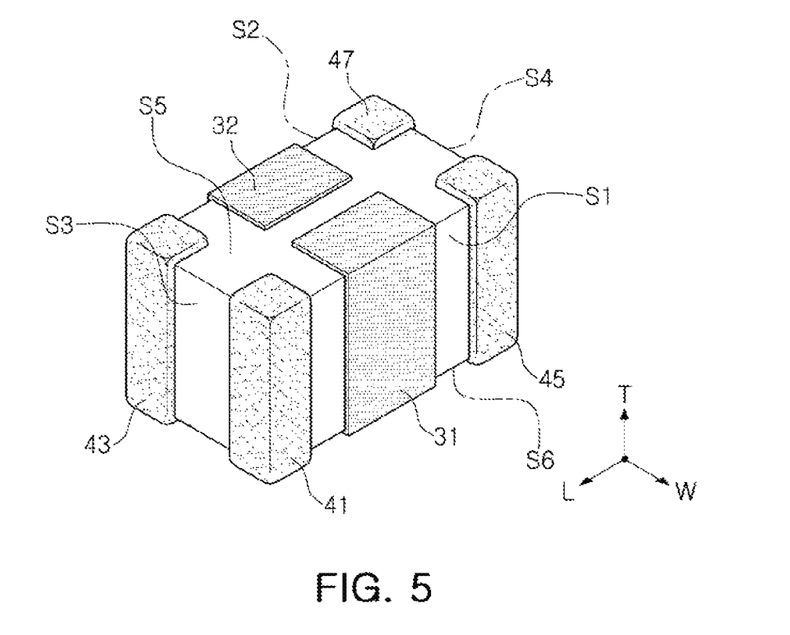
FIG. 5 is a schematic perspective view of a chip electronic component according to a modified example of an exemplary embodiment in FIG. 4.

Meanwhile, FIG. 5 illustrates a modified example of the chip electronic component according to an exemplary embodiment illustrated in FIG. 4.

The chip electronic component according to an exemplary embodiment may include a first protection member 41 extended from a first corner protection portion 41a formed on portions of surfaces adjacent to a first corner to be integrally formed with a second corner protection portion 41b formed on portions of surfaces adjacent to a second corner, and disposed on an edge formed by a first surface S1 and a third surface S3 of the body.

In other words, the first protection member 41 may substantially include the first corner protection portion 41a and the second corner protection portion 41b.

In addition, the chip electronic component includes the first protection member 41, and further includes a third protection member 43 parallel to the first protection member, and disposed on an edge formed by the second surface S2 and the third surface S3 of the body, a fifth protection member 45 parallel to the first protection member, and disposed on an edge formed by the first surface S1 and the fourth surface S4 of the body, and a seventh protection member 47 parallel to the first protection member, and disposed on an edge formed by the second surface S2 and the fourth surface S4 of the body.

Figure 6:
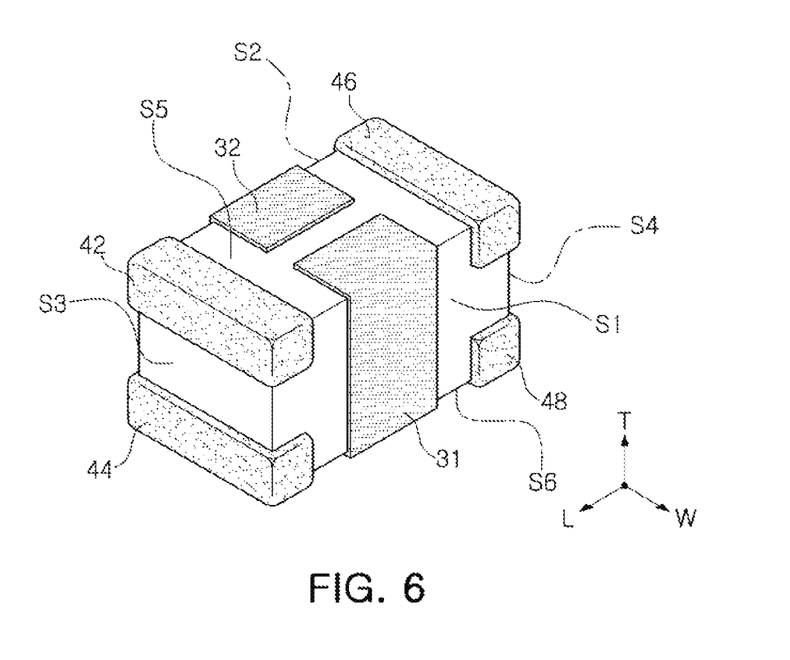
FIG. 6 is a schematic perspective view of a chip electronic component according to another exemplary embodiment in the present disclosure.

FIG. 6 illustrates an example of a chip electronic component according to another exemplary embodiment. A chip electronic component according to FIG. 6 may include a second protection member 42 extended from the first corner protection portion 41a formed on portions of surfaces adjacent to the first corner, integrally formed with a third corner protection portion formed on portions of surfaces adjacent to the third corner, and disposed on an edge formed by the third surface S3 and the fifth surface S5 of the body.

In other words, the second protection member 42 may substantially include the first corner protection portion 41a and the third corner protection portion 43a.

In addition, the chip electronic component includes the second protection member 42, and may further include a fourth protection member 44 parallel to the second protection member, and disposed on an edge formed by the third surface S3 and the sixth surface S6 of the body, a sixth protection member 46 parallel to the second protection member, and disposed on an edge formed by the fourth surface S4 and the fifth surface S5 of the body, and an eighth protection member 48 parallel to the second protection member, and disposed on an edge formed by the fourth surface S4 and the sixth surface S6 of the body.

Figure 7:
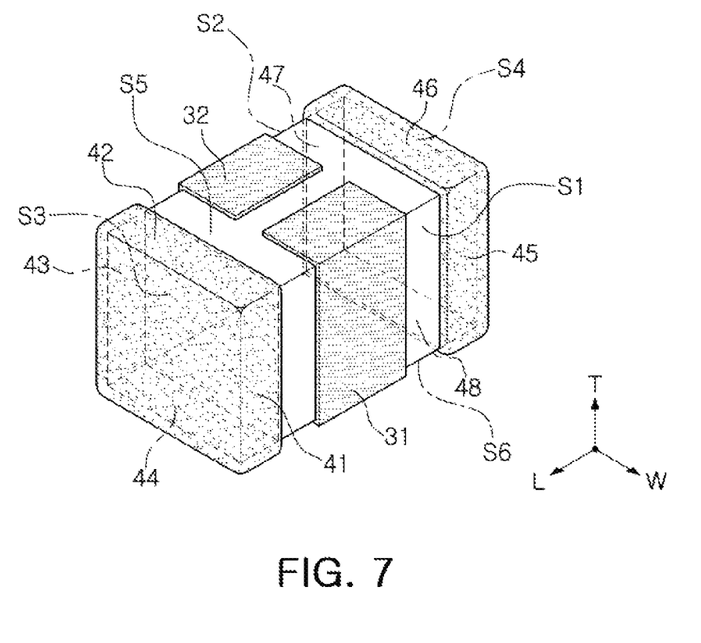
FIG. 7 is a schematic perspective view of a chip electronic component according to another exemplary embodiment in the present disclosure.

Next, FIG. 7 illustrates a chip electronic component as another example according to an exemplary embodiment, including protection members connecting first to fourth protection members 41 to 44 and fifth to eighth protection members 45 to 48 disposed on a body 10.

Here, a method of forming first to eighth protection members may vary. For example, a method in which an insulating resin is cured after a proper amount of the insulating resin is pasted on the body, may be used.

In addition, the chip electronic component may include protection members connecting the first to fourth protection members 41 to 44 and the fifth to eighth protection members 45 to 48, and may include protection members integrally formed with the protection member connecting the first to fourth protection members and the fifth to eighth protection members on surfaces of a third surface and a fourth surface opposing each other in a length direction of the body, respectively.

In this case, in a manner similar to the method of forming the first to eighth protection members, a method of forming the protection member may be a method in which an insulating resin is cured after a proper amount of the insulating resin is pasted on the body. In this case, the first to fourth protection members and the fifth to eighth protection members, and the protection members disposed on the third surface and the fourth surface of the body may be integrally formed, respectively.

As another method, for example, for a method of forming a Cu plating layer, during a process in which an external electrode disposed on a body is sintered, a plating material including Cu is sintered to form the protection member.

Figure 8:
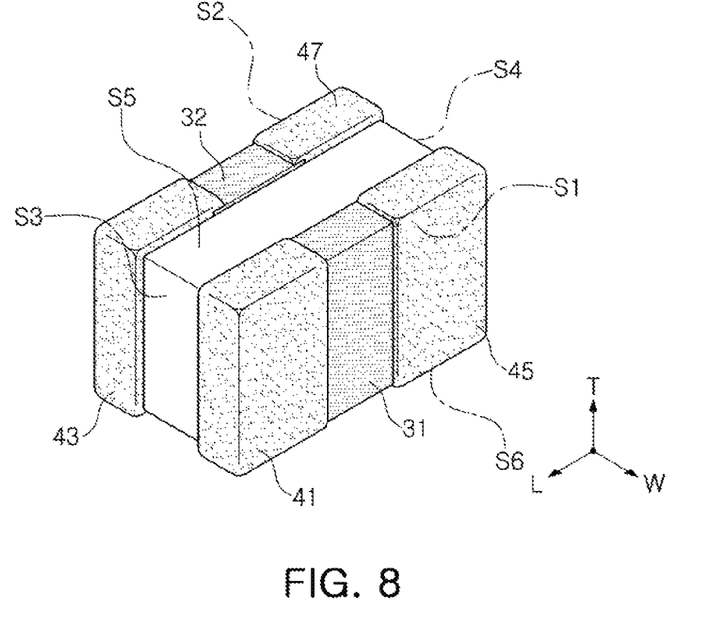
FIG. 8 is a schematic perspective view of a chip electronic component according to a modified example of an exemplary embodiment in FIG. 5.

FIG. 8 is one example of a chip electronic component according to an exemplary embodiment, as a modified example of a chip electronic component shown in FIG. 5.

In FIG. 8, among a first protection member 41, a third protection member 43, a fifth protection member 45, and a seventh protection member 47, disposed on a body, the first protection member 41 and the fifth protection member 45 may be extended to a boundary area of a region of a first surface S1 of the body, on which a first external electrode 31 is disposed, and the third protection member 43 and the seventh protection member 47 may be extended to a boundary area of a region of a second surface S2 of the body, on which a second external electrode 32 is disposed.

In this case, in the chip electronic component, eight corners of the body are applied with protection portions, respectively, and thus, occurrence of chipping generated from external impacts between chip electronic components may be prevented. Furthermore, the first, third, fifth, and seventh protection members 41, 43, 45, and 47 are extended to surface regions of the body on which the first external electrode 31 and the second external electrode 32 are formed. In detail, water resistance properties in edges of the external electrodes, which are vulnerable to water resistance load, may be improved.

The first, third, fifth, and seventh protective members 41, 43, 45, and 47 of the chip electronic component may be formed by applying an insulating material, for example, insulating epoxy before a plating process for formation of the first external electrode 31 and the second external electrode 32, but a forming method is not limited thereto.

Figure 9:
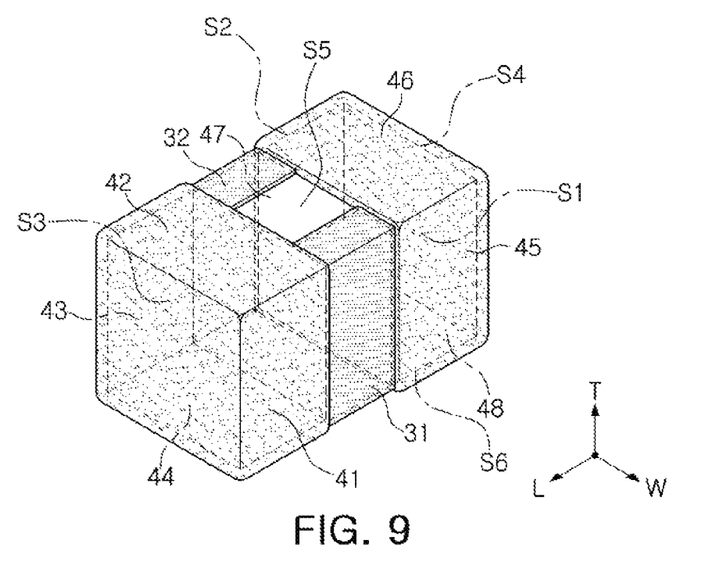
FIG. 9 is a schematic perspective view of a chip electronic component according to a modified example of an exemplary embodiment in FIG. 7.

FIG. 9 is an example of a chip electronic component according to another exemplary embodiment, as a modified example of the chip electronic component in FIG. 7.

The chip electronic component in FIG. 9 includes first to eighth protection members 41 to 48 disposed on eight edges of a body. The first protection member 41 and the fifth protection member 45 are extended to a boundary area of a region of a first surface S1 of the body, on which a first external electrode 31 is disposed, and the third protection member 43 and the seventh protection member 47 are extended to a boundary area of a region of a second surface S2 of the body, on which a second external electrode 32 is disposed. In addition, the second, fourth, sixth, and eighth protection members 42, 44, 46, and 48 may be extended onto a third surface S3 or a fourth surface S4 of the body, and may be extended to boundary areas of regions on which the first external electrode 31 and the second external electrode 32 are disposed.

In this case, in the chip electronic component, eight corners of the body are applied with protection portions, respectively, and thus, chipping generated between chip electronic components may be prevented. In detail, the first to eighth protection members are extended to surface regions of the body, on which a first external electrode 31 and a second external electrode 32 are formed, and thus water resistance properties in edges of the external electrodes vulnerable to water resistance load, may be improved.

In the chip electronic component according to an exemplary embodiment, as a distance between a first surface S1 and a second surface S2 of the body on which a first external electrode 31 and a second external electrode 32 are disposed, is equal to or less than a distance between a third surface S3 and a fourth surface S4 of the body, a distance between the first external electrode 31 and the second external electrode 32 is reduced. As a result, as a current path is shorter, a current loop is reduced, and thus, inductance may be reduced.

In addition, in the chip electronic component according to an exemplary embodiment, as the first external electrode 31 and the second external electrode 32 are formed on the first surface S1 and the second surface S2 opposing each other in a width direction of the body, variations in contraction and expansion are minimized, thereby reducing acoustic noise which may be generated after the chip electronic component is mounted on a board.

However, in the case of the chip electronic component described above, as the first external electrode 31 and the second external electrode 32 are disposed on the first surface S1 and the second surface S2 of the body, eight corners formed by three adjacent surfaces of the first to sixth surfaces of the body, are exposed as it is without protection of an external electrode, whereby chipping caused by movement between processes and physical impacts between chip electronic components during a process may occur. Thus, a protection portion is disposed on at least one corner of the eight corners, thereby effectively preventing undesired chipping.

In addition, the chip electronic component according to an exemplary embodiment may prevent chipping, and may improve water resistance properties in edges of an external electrode as a protection portion may be extended to boundary areas of regions of surfaces of a body, on which the external electrode is formed.

Board Having Chip Electronic Component Mounted Thereon

Figure 10:
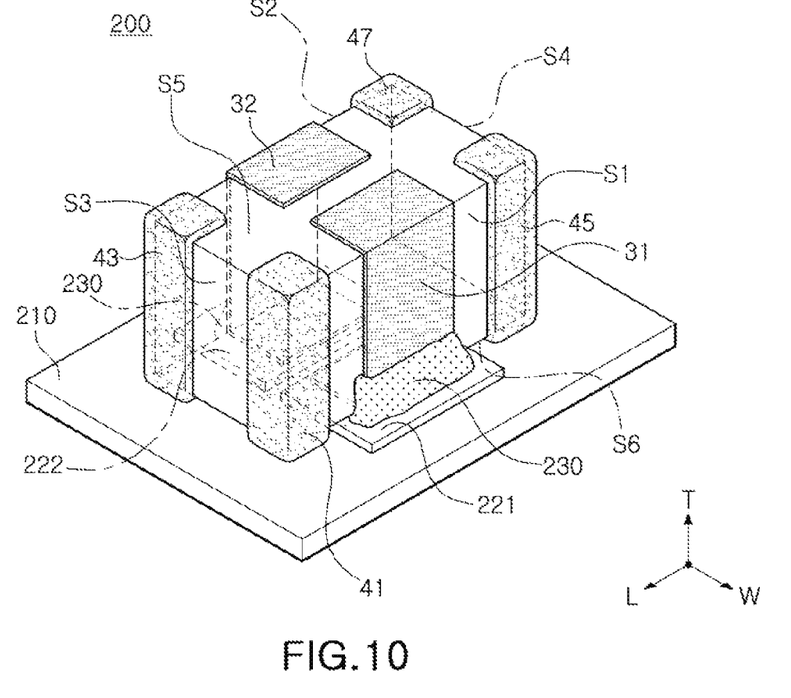
FIG. 10 is a schematic perspective view illustrating a board on which the chip electronic component in FIG. 5 is mounted.

FIG. 10 is a perspective view illustrating a structure in which a chip electronic component in FIG. 5 is mounted on a board.

With reference to FIG. 10, a mounting board 200 having a chip electronic component thereon according to an exemplary embodiment includes a board 210 on which the chip electronic component is mounted, and a first electrode pad 221 and a second electrode pad 222 formed to be spaced apart from each other on an upper surface of the board 210.

In this case, the chip electronic component may be electrically connected to the board 210 by a solder 230 while a first external electrode and a second external electrode are located to be in contact with a first electrode pad 221 and a second electrode pad 222, respectively.

As described above, while the chip electronic component 1 is mounted on the board 210, when a voltage is applied thereto, acoustic noise may be generated.

In this case, sizes of the first electrode pad 221 and the second electrode pad 222 may allow an amount of a solder for connection of the external electrode of the chip electronic component 1 with the first electrode pad 221 and the second electrode pad 222 to be determined. According to the amount of the solder 230, a level of acoustic noise may be controlled.

Here, in the chip electronic component according to an exemplary embodiment, the first external electrode and the second external electrode are disposed on the first surface and the second surface of the body, in which a distance therebetween is equal to or less than a distance between the third surface and the fourth surface opposing each other of the body of the chip electronic component, respectively. Thus, variations in contraction and expansion are minimized, thereby reducing acoustic noise.

In addition, in the chip electronic component according to an exemplary embodiment, a distance between the first external electrode and the second external electrode may be reduced, thereby minimizing equivalent series resistance.

In addition, in the chip electronic component according to an exemplary embodiment, a protection portion is disposed on a corner and an edge between different surfaces of the body, thereby improving reliability and a production yield through chipping prevention and improving water resistance properties.

As set forth above, according to an exemplary embodiment in the present disclosure, a chip electronic component having improved equivalent series resistance (ESR) properties, and a board having the same mounted thereon, may be provided.

When the chip electronic component is mounted on the board, the chip electronic component in which a solder crack and acoustic noise generated in the chip electronic component are reduced, and a board having the same mounted thereon, may be provided.

The chip electronic component having improved reliability and an improved production yield as chipping, due to movement between processes of manufacturing the chip electronic component and physical collisions between the chip electronic components during a process thereof, may be prevented and water resistance properties on edges of an external electrode may be improved, and a board having the same mounted thereon, may be provided.

While exemplary embodiments have been shown and described above, it will be apparent to those skilled in the art that modifications and variations could be made without departing from the scope of the present invention as defined by the appended claims.

What is claimed is:

1. A chip electronic component comprising:
 a body having a first surface and a second surface opposing each other, a third surface and a fourth surface opposing each other, and a fifth surface and a sixth surface opposing each other, and in which a distance from the first surface to the second surface is equal to or less than a distance from the third surface to the fourth surface;
 a first internal electrode formed in an interior of the body, exposed to the first surface of the body, and spaced apart from the third surface and the fourth surface of the body, and a second internal electrode formed in the interior of the body, exposed to the second surface of the body, and spaced apart from the third surface and the fourth surface of the body; and
 a first external electrode formed on the first surface of the body and connected to the first internal electrode, and
 a second external electrode formed on the second surface of the body and connected to the second internal electrode,
 wherein a first corner protection portion is disposed on portions of surfaces adjacent to a first corner, where the first corner is a corner formed by the first surface, the third surface and the fifth surface of the body.

2. The chip electronic component of claim 1, wherein the first internal electrode includes a first lead portion exposed to the first surface of the body, and the second internal electrode includes a second lead portion exposed to the second surface of the body.

3. The chip electronic component of claim 1, further comprising a second corner protection portion disposed on portions of surfaces adjacent to a second corner opposing the first corner, where the second corner is a corner formed by the first surface, the third surface and the sixth surface of the body.

4. The chip electronic component of claim 3, further comprising a first protection member extending from the first corner protection portion formed on the portions of the surfaces adjacent to the first corner to be integrally formed with the second corner protection portion formed on the portions of the surfaces adjacent to the second corner, and disposed on an edge formed by the first surface and the third surface of the body.

5. The chip electronic component of claim 4, further comprising:
 a third protection member parallel to the first protection member, and disposed on an edge formed by the second surface and the third surface of the body,
 a fifth protection member parallel to the first protection member, and disposed on an edge formed by the first surface and the fourth surface of the body, and
 a seventh protection member parallel to the first protection member, and disposed on an edge formed by the second surface and the fourth surface of the body.

6. The chip electronic component of claim 5, wherein the first protection member is extended onto the third surface of the body to be connected to the third protection member, and the fifth protection member is extended onto the fourth surface of the body to be connected to the seventh protection member.

7. The chip electronic component of claim 5,
 wherein the first protection member and the fifth protection member are extended to a boundary area of a region of the first surface of the body, on which the first external electrode is disposed, and
 the third protection member and the seventh protection member are extended to a boundary area of a region of the second surface of the body, on which the second external electrode is disposed.

8. The chip electronic component of claim 1, further comprising a third corner protection portion disposed on portions of surfaces adjacent to a third corner opposing the first corner, where the third corner is a corner formed by the second surface, the third surface and the fifth surface of the body.

9. The chip electronic component of claim 8, further comprising a second protection member extending from the first corner protection portion formed on the portions of the surfaces adjacent to the first corner to be integrally formed with the third corner protection portion formed on the portions of the surfaces adjacent to the third corner, and disposed on an edge formed by the third surface and the fifth surface of the body.

10. The chip electronic component of claim 9, further comprising:
a fourth protection member parallel to the second protection member, and disposed on an edge formed by the third surface and the sixth surface of the body,
a sixth protection member parallel to the second protection member, and disposed on an edge formed by the fourth surface and the fifth surface of the body, and
an eighth protection member parallel to the second protection member, and disposed on an edge formed by the fourth surface and the sixth surface of the body.

11. The chip electronic component of claim 1, wherein the first corner protection portion is formed of an insulating material.

12. The chip electronic component of claim 1, wherein the first corner protection portion is formed of a plating material including copper (Cu).

13. The chip electronic component of claim 1, wherein the first corner protection portion is formed of a heat curable resin.

14. The chip electronic component of claim 1, wherein the first corner protection portion is formed of at least one selected from a group consisting of an epoxy resin, a cyanateester resin, a maleimide resin, a bismaleimide-triazine resin, a phenolic resin, a resorcinol resin, a unsaturated polyester resin, a diallylphthalate resin, a urea resin, melamine resin, a benzoxazine resin, polyurethane, and a mixture thereof.

15. A board having a chip electronic component mounted thereon comprising:
a board including an electrode pad on an upper surface thereof;
a chip electronic component installed on the board; and
a solder connecting the electrode pad to the chip electronic component,
wherein the chip electronic component includes:
a body having a first surface and a second surface opposing each other, a third surface and a fourth surface opposing each other, and a fifth surface and a sixth surface opposing each other, and in which a distance from the first surface to the second surface is equal to or less than a distance from the third surface to the fourth surface,
a first internal electrode formed in an interior of the body, exposed to the first surface of the body, and spaced apart from the third surface and the fourth surface of the body, and a second internal electrode formed in the interior of the body, exposed to the second surface of the body, and spaced apart from the third surface and the fourth surface of the body; and
a first external electrode formed on the first surface of the body and connected to the first internal electrode, and a second external electrode formed on the second surface of the body and connected to the second internal electrode, and
a first corner protection portion is disposed on portions of surfaces adjacent to a first corner, where the first corner is a corner formed by the first surface, the third surface and the fifth surface of the body.

16. The board having a chip electronic component mounted thereon of claim 15, wherein the chip electronic component includes a first protection member extended from the first corner protection portion formed on the portions of the surfaces adjacent to the first corner to be integrally formed with a second corner protection portion formed on portions of surfaces adjacent to a second corner opposing the first corner, where the second corner is a corner formed by the first surface, the third surface and the sixth surface of the body, and
further includes a third protection member parallel to the first protection member and disposed on an edge formed by the second surface and the third surface of the body, a fifth protection member parallel to the first protection member and disposed on an edge formed by the first surface and the fourth surface of the body, and a seventh protection member parallel to the first protection member and disposed on an edge formed by the second surface and the fourth surface of the body.

17. The board having a chip electronic component mounted thereon of claim 16, wherein the chip electronic component is provided with the first protection member and the fifth protection member extended to a boundary area of a region of the first surface of the body, on which the first external electrode is disposed, and
the third protection member and the seventh protection member extended to a boundary area of a region of the second surface of the body, on which the second external electrode is disposed.

18. The board having a chip electronic component mounted thereon of claim 16, wherein the first corner protection portion is formed of an insulating material.

19. The board having a chip electronic component mounted thereon of claim 16, wherein the first corner protection portion is formed of a plating material including copper (Cu).

* * * * *